(12) United States Patent
Balasubramanian

(10) Patent No.: US 7,981,749 B2
(45) Date of Patent: Jul. 19, 2011

(54) MOS STRUCTURES THAT EXHIBIT LOWER CONTACT RESISTANCE AND METHODS FOR FABRICATING THE SAME

(75) Inventor: Sriram Balasubramanian, Fremont, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 792 days.

(21) Appl. No.: 11/841,161

(22) Filed: Aug. 20, 2007

(65) Prior Publication Data

US 2009/0050984 A1 Feb. 26, 2009

(51) Int. Cl.
*H01L 21/336* (2006.01)

(52) U.S. Cl. .. 438/289; 438/300; 438/304; 257/E21.409

(58) Field of Classification Search ............... 438/289, 438/300–304, 655, 778
See application file for complete search history.

(56) References Cited

U.S. PATENT DOCUMENTS

| | | | |
|---|---|---|---|
| 6,136,698 | A | 10/2000 | Lu |
| 7,265,059 | B2 * | 9/2007 | Rao et al. ............... 438/734 |
| 7,749,905 | B2 * | 7/2010 | Cohen et al. ............ 438/682 |
| 2003/0006462 | A1 | 1/2003 | Quek et al. |
| 2003/0148563 | A1 | 8/2003 | Nishiyama |
| 2004/0129981 | A1 | 8/2004 | Kim et al. |
| 2005/0170571 | A1 * | 8/2005 | Dietz et al. .............. 438/164 |
| 2006/0157749 | A1 * | 7/2006 | Okuno ..................... 257/288 |
| 2007/0020565 | A1 * | 1/2007 | Koh et al. ................ 430/313 |
| 2007/0077743 | A1 * | 4/2007 | Rao et al. ................ 438/595 |
| 2008/0008969 | A1 * | 1/2008 | Zhou et al. .............. 430/313 |
| 2008/0169495 | A1 * | 7/2008 | Orner et al. ............. 257/312 |
| 2008/0261349 | A1 * | 10/2008 | Abatchev et al. ......... 438/106 |
| 2009/0039420 | A1 * | 2/2009 | Trivedi et al. ............ 257/329 |

FOREIGN PATENT DOCUMENTS

| | | |
|---|---|---|
| JP | 05 315613 A | 11/1993 |
| JP | 07 183486 A | 7/1995 |
| JP | 2004260003 A | 9/2004 |
| KR | 2004 0065339 A | 7/2004 |

OTHER PUBLICATIONS

PCT International Search Report for International application No. PCT/US08/008801: dated Oct. 6, 2008.

* cited by examiner

*Primary Examiner* — Savitri Mulpuri
(74) *Attorney, Agent, or Firm* — Ingrassia Fisher & Lorenz, P.C.

(57) ABSTRACT

MOS structures that exhibit lower contact resistance and methods for fabricating such MOS structures are provided. In one method, a semiconductor substrate is provided and a gate stack is fabricated on the semiconductor substrate. An impurity-doped region within the semiconductor substrate aligned with the gate stack is formed. Adjacent contact fins extending from the impurity-doped region are fabricated and a metal silicide layer is formed on the contact fins. A contact to at least a portion of the metal silicide layer on at least one of the contact fins is fabricated.

9 Claims, 10 Drawing Sheets

MOS STRUCTURES THAT EXHIBIT LOWER CONTACT RESISTANCE AND METHODS FOR FABRICATING THE SAME

FIELD OF THE INVENTION

The present invention generally relates to MOS structures and methods for fabricating MOS structures, and more particularly relates to MOS structures that exhibit lower contact resistance and methods for fabricating such MOS structures.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). An MOS transistor includes a gate electrode as a control electrode that is formed overlying a semiconductor substrate and spaced-apart source and drain regions that are formed within the semiconductor substrate and between which a current can flow. A control voltage applied to the gate electrode controls the flow of current through a channel in the semiconductor substrate between the source and drain regions and beneath the gate electrode.

The MOS transistor is accessed via a conductive contact typically formed on the source/drain regions between the gate electrodes of two MOS transistors. The conductive contact is usually formed by depositing an insulating layer over the source/drain regions and etching a contact opening in the insulating layer. A thin barrier layer, typically of titanium nitride and/or other metals and alloys, is deposited in the contact opening and the opening then is filled by a chemical vapor deposited layer of tungsten.

There is a continuing trend to incorporate more and more circuitry on a single IC chip. To incorporate the increasing amount of circuitry, the size of each individual device in the circuit and the size and spacing between device elements must decrease. However, one of the limiting factors in the continued shrinking of integrated semiconductor devices is the resistance of contacts to doped regions such as the source and drain regions of an MOS transistor. As device sizes decrease, the width of the contact decreases. As the width of the contact decreases, the resistance of the contact becomes increasingly larger. In turn, as the resistance of the contact increases, the drive current of the device decreases, thus adversely affecting device performance.

Accordingly, it is desirable to provide MOS structures that exhibit lower contact resistance. In addition, it is desirable to provide methods for fabricating MOS structures that exhibit lower contact resistance. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating an MOS structure in accordance with an exemplary embodiment of the present invention is provided. The method comprises providing a semiconductor substrate and fabricating a gate stack on the semiconductor substrate. An impurity-doped region within the semiconductor substrate aligned with the gate stack is formed. Adjacent contact fins extending from the impurity-doped region are fabricated and a metal silicide layer is formed on the contact fins. A contact to at least a portion of the metal silicide layer on at least one of the contact fins is fabricated.

A method for fabricating an MOS structure in accordance with another exemplary embodiment of the invention is provided. The method comprises the steps of providing a semiconductor substrate and fabricating a gate stack on the semiconductor substrate. Using the gate stack as mask, impurity dopants are implanted into a semiconductor material disposed proximate to the gate stack. The semiconductor material has a first surface. A trench is etched into the semiconductor material such that the semiconductor material has a trench surface within the trench. A metal silicide layer is formed on the first surface of the semiconductor material and on the trench surface. A contact to at least a portion of the metal silicide layer on the first surface and at least a portion of the metal silicide layer on the trench surface is fabricated.

An MOS structure in accordance with an exemplary embodiment of the present invention is provided. The MOS structure comprises a semiconductor substrate, a gate stack formed on the semiconductor substrate, and an impurity-doped region disposed within the semiconductor substrate and self-aligned with the gate stack. Two adjacent contact fins are disposed on the impurity-doped region and a metal silicide layer overlies the two adjacent contact fins. A conductive contact extends to at least a portion of the metal silicide layer on at least one sidewall of at least one of the two adjacent contact fins. The conductive contact is in electrical communication with the gate stack through at least one of the two adjacent contact fins.

An MOS structure in accordance with another exemplary embodiment of the present invention is provided. The MOS structure comprises a semiconductor substrate, a gate stack formed on the semiconductor substrate, and an impurity-doped semiconductor material disposed proximate to the gate stack. The impurity-doped semiconductor material has a first surface. A trench is disposed at least partially within the impurity-doped semiconductor material. The impurity-doped semiconductor material has a trench surface within the trench. A metal silicide layer is disposed on the first surface and on the trench surface and a conductive contact extends to at least a portion of the metal silicide layer on the first surface and at least a portion of the metal silicide layer on the trench surface.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 16:
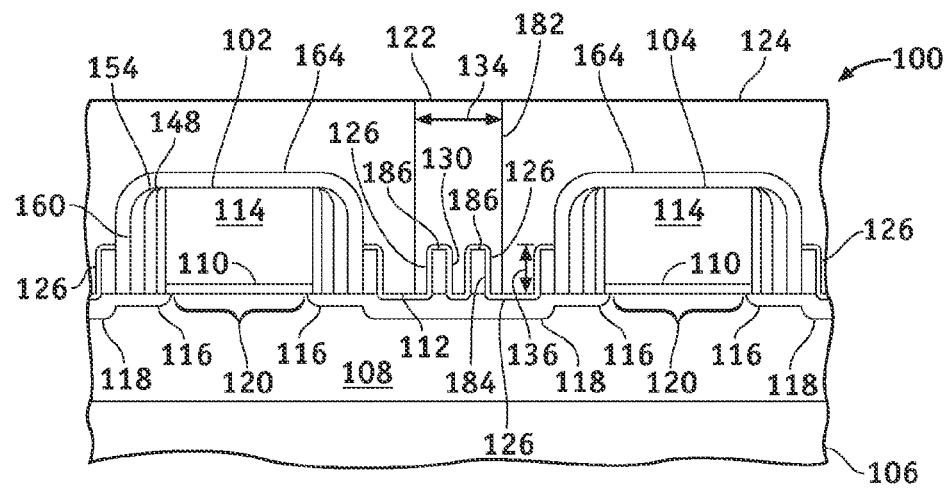

FIG. 16 is a cross-sectional view of an MOS structure 100 in accordance with an exemplary embodiment of the present invention. MOS structure 100 is illustrated having a first MOS transistor 102 and a second MOS transistor 104. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. MOS transistors 102 and 104 can be PMOS transistors or NMOS transistors. While semiconductor device 100 is illustrated with only two MOS transistors, it will be appreciated that semiconductor device 100 may have any number of NMOS transistors and/or PMOS transistors. Those of skill in the art will appreciate that device 100 may include a large number of such transistors as required to implement a desired circuit function.

MOS transistors 102 and 104 are fabricated on a semiconductor substrate 106 which can be either a bulk silicon wafer as illustrated or a thin silicon layer on an insulating substrate (SOI). At least a portion 108 of the semiconductor substrate 106 is doped with P-type conductivity-determining impurities for the fabrication of an NMOS transistor or with N-type conductivity-determining impurities for the fabrication of a PMOS transistor. Portion 108 can be impurity doped, for example, by the implantation and subsequent thermal annealing of dopant ions such as boron or arsenic.

MOS transistors 102 and 104 each include a gate insulator 110 formed at a surface 112 of the semiconductor substrate 106. A gate electrode 114 overlies the gate insulator 110. The gate electrode 114 may be formed of polycrystalline silicon or other conductive material such as metal. Source and drain extensions 116 and deeper source and drain regions 118 are disposed within silicon substrate 106 and are separated by a channel region 120 disposed below the gates electrode 114 within the silicon substrate 106.

Figure 28:
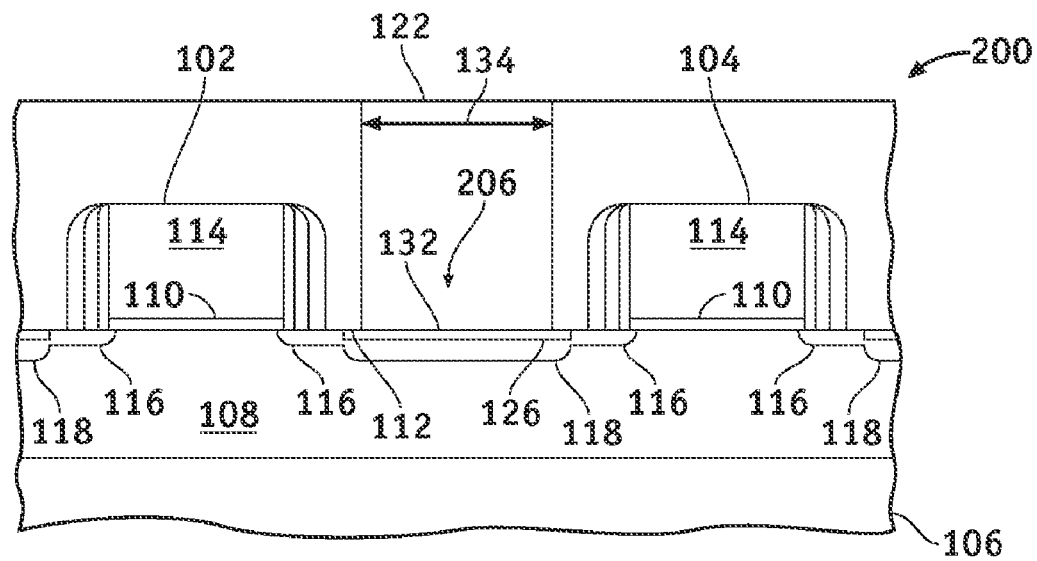
FIG. 28 is a cross-sectional view of a conventional MOS structure having two MOS transistors and a conductive contact in electrical communication therewith.

MOS structure 100 also comprises a conductive contact 122 that is formed within a dielectric layer 124 that overlies MOS transistors 102 and 104. The conductive contact 122 is disposed on and is in electrical communication with a metal silicide layer 126 that is disposed, at least partially, on a feature that increases the interface between the metal silicide layer 126 and the contact 122. In the present embodiment, the feature comprises two adjacent stand-alone contact fins 186. Contact fins 186 are disposed on surface 112 of substrate 106 and extend or protrude from surface 112 by a height indicated by double-headed arrow 136. FIG. 28 is a cross-sectional view of a conventional MOS structure with metal silicide layer 126 formed on surface 112 of semiconductor substrate 106. Referring momentarily to FIGS. 16 and 28, although a width of contact 122, illustrated by double-headed arrow 134, may be small, contact fins 186, and metal silicide layer 126 disposed thereon, provide an interface 130 with contact 122 (FIG. 16) that is greater than an interface 132 of that portion of surface 112 of substrate 106 upon which metal silicide layer 126 lies with contact fins 186 absent (FIG. 28). Specifically, the interface 132 has an area that is equal to width W(134) multiplied by a perpendicular length L (not shown) of the contact, that is, L×W(134). In contrast, in one embodiment of the invention, the interface 130 is equal to the sum of width W(134) and four times the height H(136) of fins 186 multiplied by length L, that is, L×(W(134)+4H(136)). The increase in the surface area of the interface results in a decrease in contact resistance between the conductive contact 122 and the source/drain regions 118 and, thus, an increase in device performance.

FIGS. 1-16 illustrate, in cross section, a method for forming an MOS structure, such as MOS structure 100 of FIG. 16, in accordance with an exemplary embodiment of the invention. Various steps in the manufacture of MOS components are well known and so, in the interest of brevity, many conventional steps will only be mentioned briefly herein or will be omitted entirely without providing the well known process details.

Figure 1:
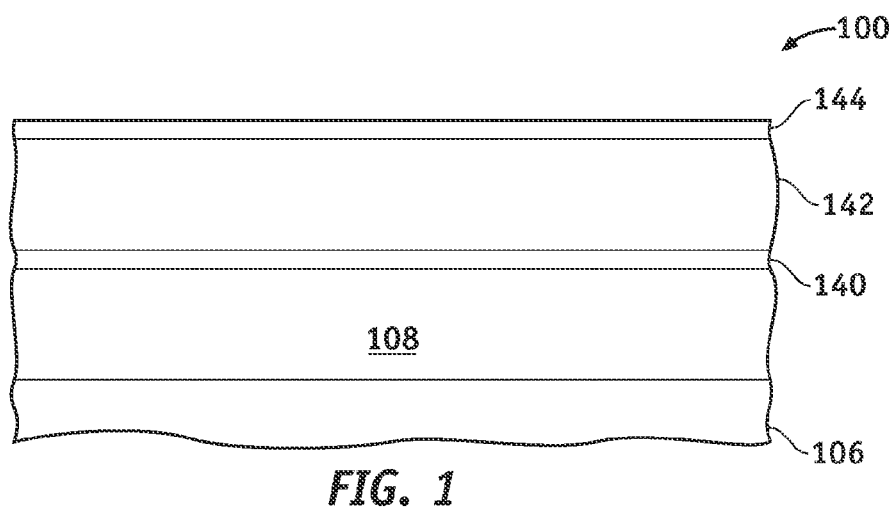
FIGS. 1-20 illustrate, in cross section, a method for fabricating an MOS structure in accordance with an exemplary embodiment of the present invention.

Referring to FIG. 1, the method begins by forming a gate insulator material 140 overlying a semiconductor substrate 106. The semiconductor substrate is preferably a silicon substrate wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. The semiconductor substrate will hereinafter be referred to for convenience, but without limitation, as a silicon substrate. The silicon substrate may be a bulk silicon wafer, or may be a thin layer of silicon on an insulating layer (commonly know as silicon-on-insulator or SOI) that, in turn, is supported by a carrier wafer. At least a surface 108 of the silicon substrate is impurity doped, for example by forming N-type well regions and P-type well regions for the fabrication of P-channel (PMOS) transistors and N-channel (NMOS) transistors, respectively.

In the conventional processing, the layer 140 of gate insulating material can be a layer of thermally grown silicon dioxide or, alternatively (as illustrated), a deposited insulator such as a silicon oxide, silicon nitride, or the like. Deposited insulators can be deposited, for example, by chemical vapor deposition (CVD), low pressure chemical vapor deposition (LPCVD), or plasma enhanced chemical vapor deposition (PECVD). Gate insulator layer 140 preferably has a thickness of about 1-10 nm, although the actual thickness can be determined based on the application of the transistor in the circuit being implemented.

A layer of gate electrode material 142 is formed overlying the gate insulating material 140. In accordance with one embodiment of the invention, the gate electrode material is polycrystalline silicon. The layer of polycrystalline silicon is preferably deposited as undoped polycrystalline silicon and is subsequently impurity doped by ion implantation. The polycrystalline silicon can be deposited by LPCVD by the hydrogen reduction of silane. A layer of hard mask material 144, such as silicon nitride or silicon oxynitride, can be deposited onto the surface of the polycrystalline silicon. The hard mask material can be deposited to a thickness of about 50 nm, also by LPCVD. Alternatively, it will be appreciated that a photoresist may be deposited onto the surface of the polycrystalline silicon instead of the hard mask material.

Figure 2:
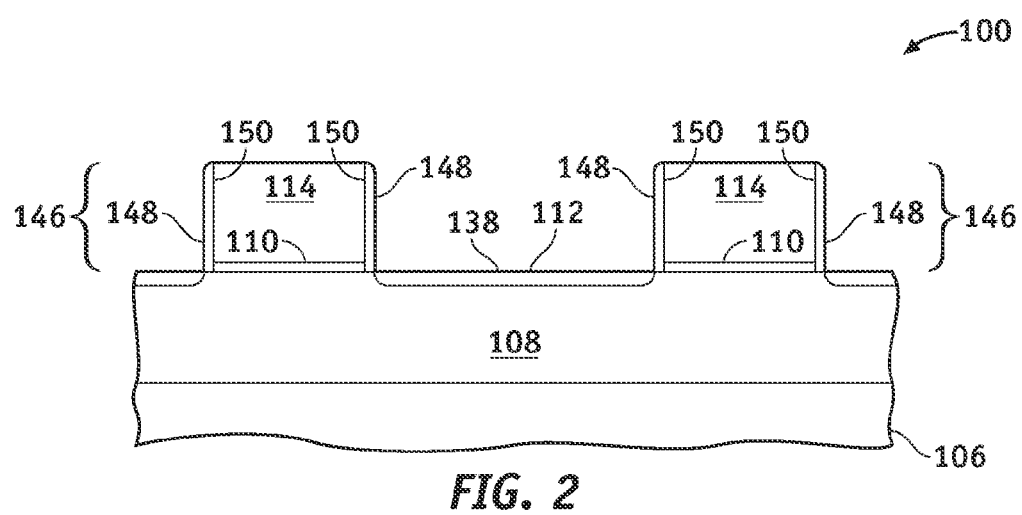

The hard mask layer 144 is photolithographically patterned and the underlying gate electrode material layer 142 and the gate insulating material layer 140 are etched to form gate stacks 146, each having a gate insulator 110 and a gate electrode 114, as illustrated in FIG. 2. The polycrystalline silicon can be etched in the desired pattern by, for example, reactive ion etching (RIE) using a Cl⁻ or HBr/$O_2$ chemistry and the hard mask and gate insulating material can be etched, for example, by RIE in a $CHF_3$, $CF_4$, or $SF_6$ chemistry. Reoxidation sidewall spacers 148 are formed about sidewalls 150 of gate stacks 146 by subjecting the gate electrodes 114 to high temperature in an oxidizing ambient. The reoxidation sidewall spacers 148 have a thickness of, for example, about 3 to 4 nm. During formation of the reoxidation spacers 148, an exposed portion 138 of substrate 106 at a surface 112 also will be oxidized.

Figure 3:
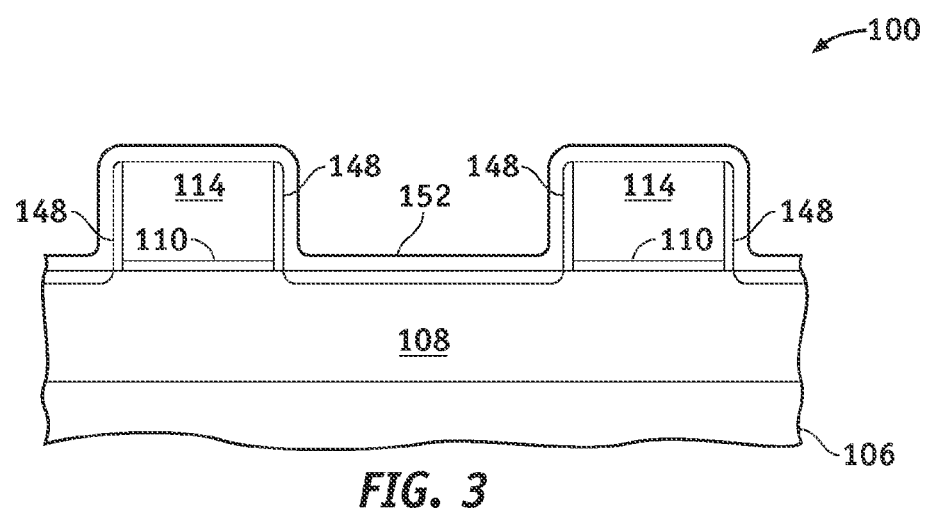
Figure 4:
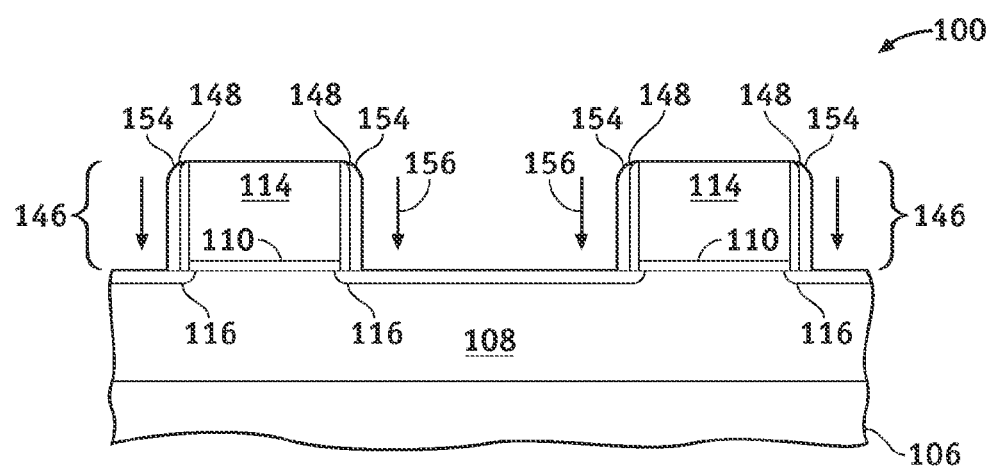

After the formation of the reoxidation sidewall spacers 148, a blanket layer 152 of dielectric material is deposited overlying MOS structure 100, as illustrated in FIG. 3. The dielectric material layer may comprise, for example, silicon dioxide. The dielectric material layer 152 is anisotropically etched, as described above, to form second spacers 154, often referred to as offset spacers, adjacent to the reoxidation sidewall spacers 148, as illustrated in FIG. 4. Oxidized portion 138 of substrate 106 also may be removed at this time. The offset spacers have a thickness of, for example, about 10 to about 20 nm. The reoxidation spacers 148 and the offset spacers 154 are used along with the gate stacks 146 as an ion implantation mask for formation of source and drain extensions 116. By using the gate stacks 146 and the spacers 148 and 154 as an ion implantation mask, the source and drain extensions are self aligned with the gate stacks and the spacers. The source and drain extensions are formed by appropriately impurity doping silicon substrate 106 in known manner, for example, by ion implantation of dopant ions, illustrated by arrows 156, and subsequent thermal annealing. For an N-channel MOS transistor the source and drain extensions 116 are preferably formed by implanting arsenic ions, although phosphorus ions could also be used. For a P-channel MOS transistor, the source and drain extensions are preferably formed by implanting boron ions.

Figure 5:
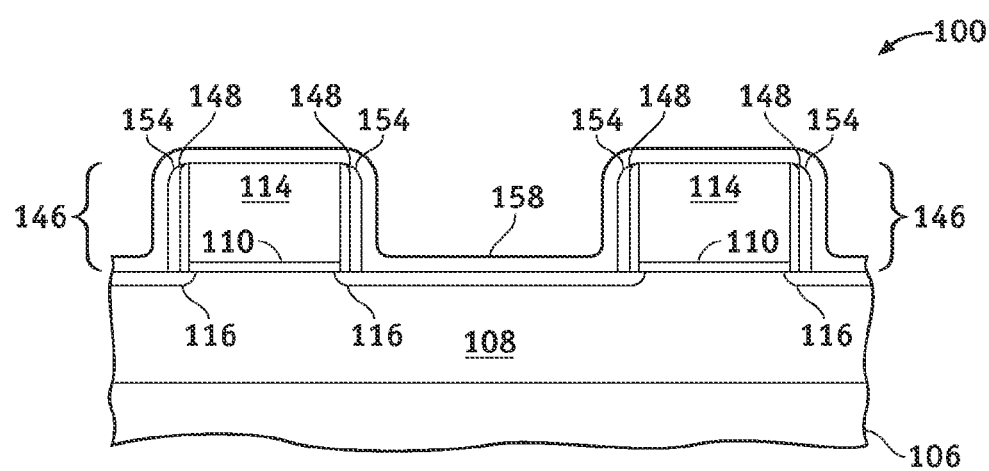
Figure 6:
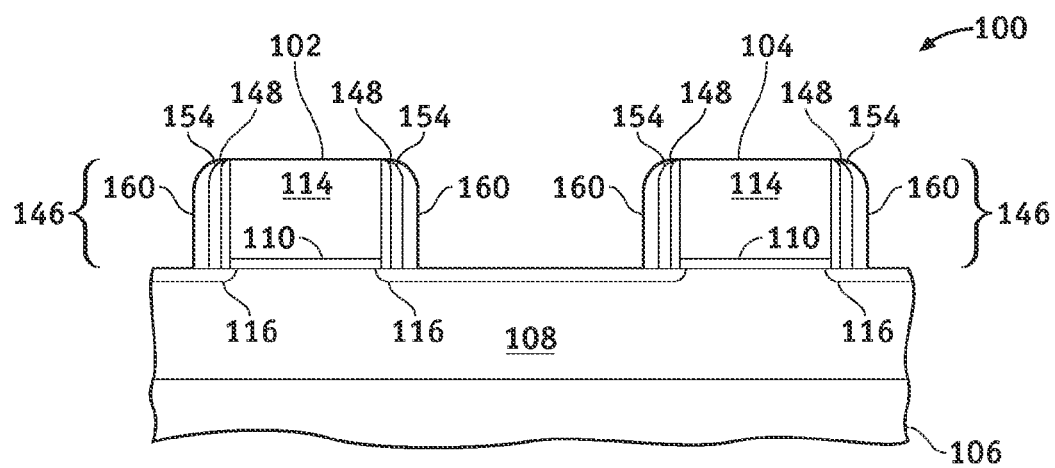

Referring to FIG. 5, a blanket layer 158 of dielectric material such as, for example, silicon nitride or silicon oxynitride, is deposited overlying MOS structure 100. The layer 158 of dielectric material is subsequently anisotropically etched, for example by RIE using, for example, a $CHF_3$, $CF_4$, or $SF_6$ chemistry, to form additional spacers 160 disposed adjacent offset spacers 154, as illustrated in FIG. 6. Although gate stacks 146 are illustrated with reoxidation sidewall spacers 148, offset spacers 154, and additional spacers 160, it will be appreciated that gate stacks 146 may have any number of spacers with any composition that is suitable for a desired circuit application or design.

Figure 7:
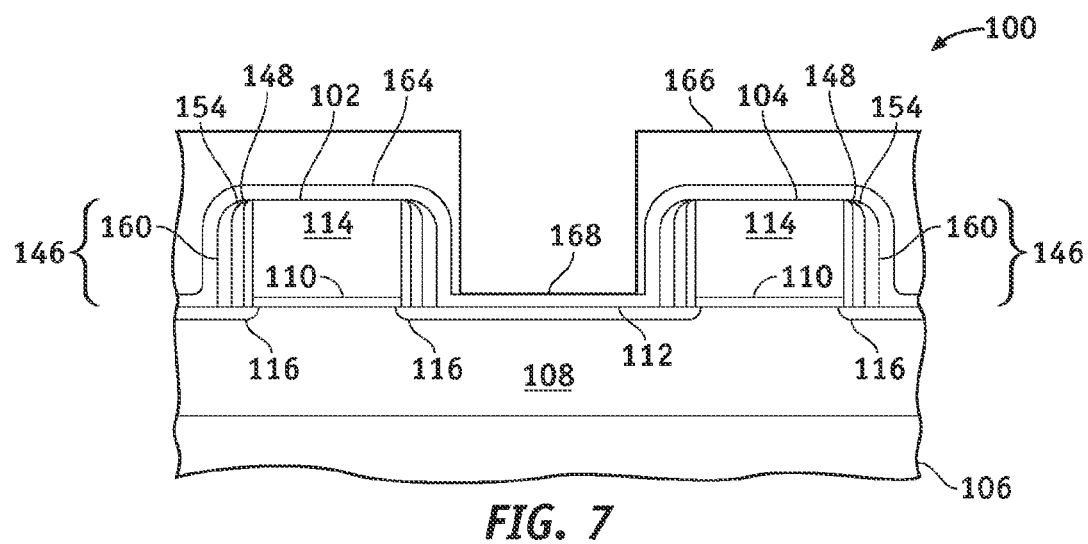
Figure 8:
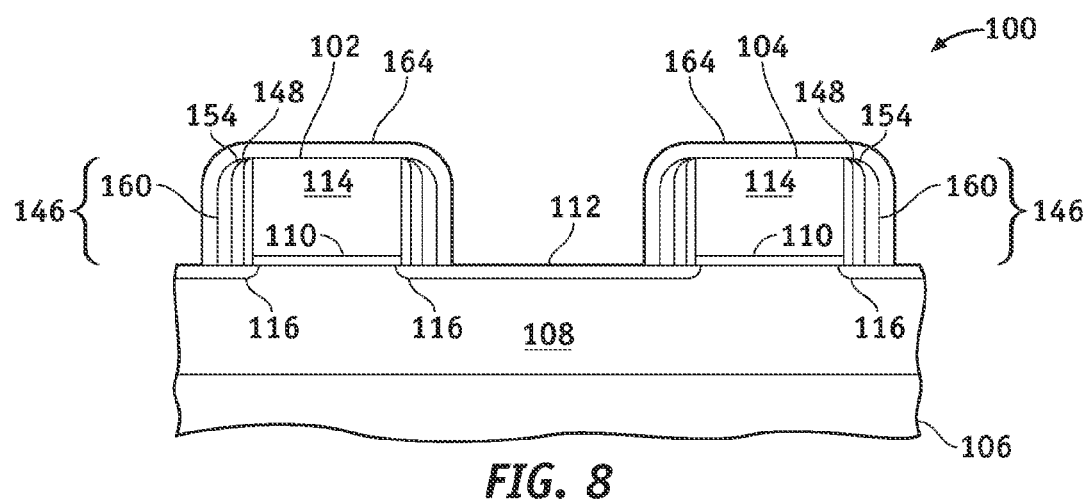

Referring to FIG. 7, a blanket dielectric material layer 164, preferably a silicon dioxide layer, is deposited overlying MOS structure 100. The dielectric material layer 164 is deposited to a thickness of, for example, about 20 to 50 nm. A layer of photoresist 166 is applied and patterned to mask gate stacks 146 and expose a portion 168 of dielectric material layer 164 that is disposed on surface 112 of semiconductor substrate 106 and that overlies source and drain extensions 116. The exposed portion 168 of dielectric material layer 164 then is removed such as by etching, for example, by RIE in a $CHF_3$, $CF_4$, or $SF_6$ chemistry to expose surface 112 of semiconductor substrate 106, as illustrated in FIG. 8. The photoresist then can be removed by conventional methods.

Figure 9:
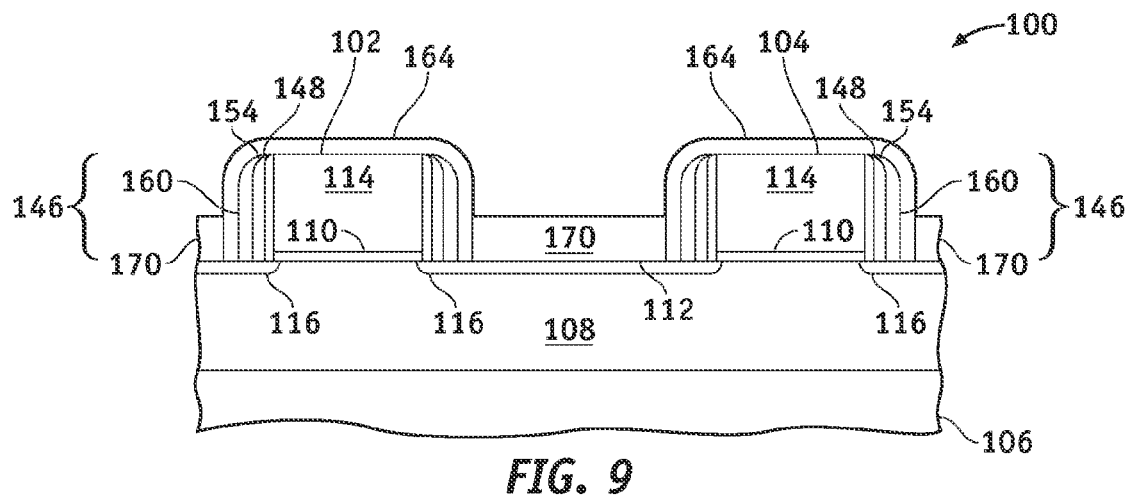

The method continues, in accordance with an exemplary embodiment of the present invention, with the epitaxial growth of a silicon layer 170 on the exposed silicon surface 112, as illustrated in FIG. 9. The epitaxial silicon layer 170 can be grown by the reduction of silane ($SiH_4$) or dichlorosilane ($SiH_2Cl_2$) in the presence of HCl. The presence of the chlorine source promotes the selective nature of the growth, that is, the growth of the epitaxial silicon preferentially on the exposed silicon surface 112 as opposed to on the silicon dioxide 164. The epitaxial silicon layer 170 may comprise relatively pure silicon materials or may comprise silicon admixed with other elements such as germanium, carbon, and the like. The epitaxial silicon layer 170 can be grown to any thickness desired for a particular device design or application. In an exemplary embodiment, the epitaxial silicon layer 170 is grown to a thickness in the range of about 10 nm to about 50 nm.

Figure 10:
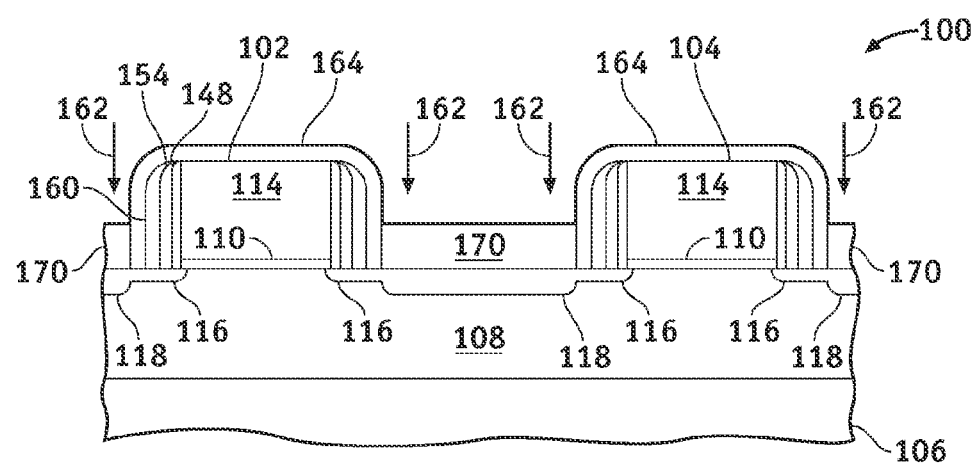

Referring to FIG. 10, in one exemplary embodiment, after the epitaxial growth of silicon layer 170, the gate stacks 146, the reoxidation sidewall spacers 148, the offset spacers 154, additional spacers 160, and dielectric material layer 164 are used as an ion implantation mask to form source and drain regions 118 in silicon substrate 106, thus forming MOS transistors 102 and 104. The source and drain regions are formed by appropriately impurity doping silicon substrate 106 in known manner, for example, by ion implantation of dopant ions, illustrated by arrows 162, and subsequent thermal annealing. For an N-channel MOS transistor, the source and drain regions 118 are preferably formed by implanting arsenic ions, although phosphorus ions could also be used. For a P-channel MOS transistor, the source and drain regions 118 are preferably formed by implanting boron ions. During formation of the source and drain regions 118, epitaxial silicon layer 170 also is impurity doped by implantation of dopant ions 162.

Figure 17:
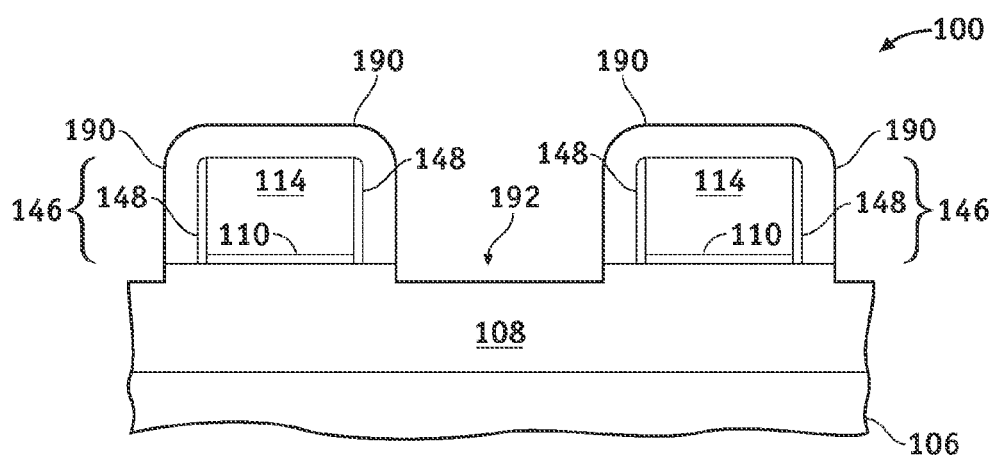

It will be understood that, while the above-described method is illustrated with the source and drain extensions 116 being formed before growth of the epitaxial silicon layer 170 and with the source and drain regions 118 being formed after growth of the epitaxial silicon layer 170, both the extensions and the regions can be formed after the growth of the epitaxial silicon layer, such as when there is a sufficiently low thermal budget, as illustrated in FIGS. 17-20. In accordance with an exemplary embodiment of the invention, after the formation of the reoxidation sidewall spacers 148 as illustrated in FIG. 2, a blanket layer of dielectric material (not shown) such as, for example, silicon dioxide, is deposited overlying MOS structure 100. A photoresist (not shown) is formed and patterned overlying the dielectric material layer and the dielectric material layer then is etched, as described above, to form disposable spacer layer 190 adjacent to the reoxidation sidewall spacers 148 and exposing substrate 106 between gate stacks 146, as illustrated in FIG. 17. The disposable spacer layer 190 has a thickness that is substantially equal to the sum of the thickness of an offset spacer 154 and an adjacent additional spacer 160. The exposed semiconductor substrate 106 then is etched, for example, by RIE in a $HBr/O_2$ and Cl chemistry to form a trench 192 therein. In one exemplary embodiment, the trench has a depth of about 30 to about 50 nm.

Figure 18:
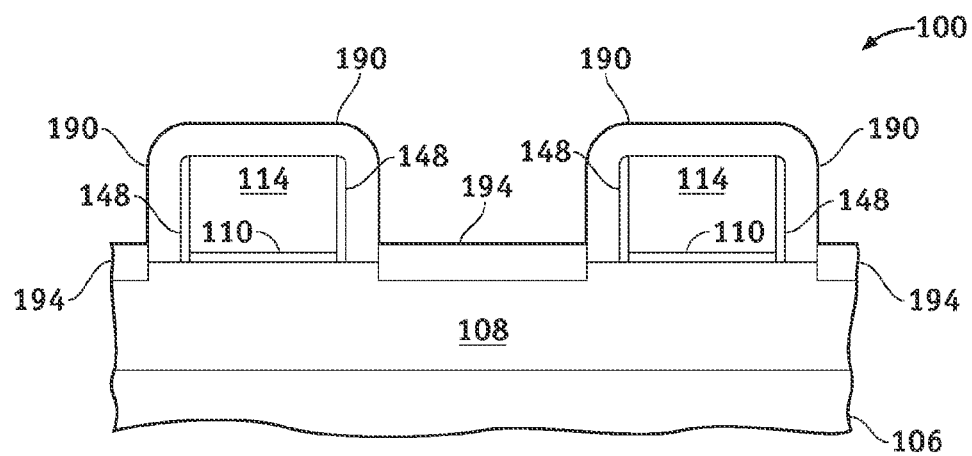
Figure 19:
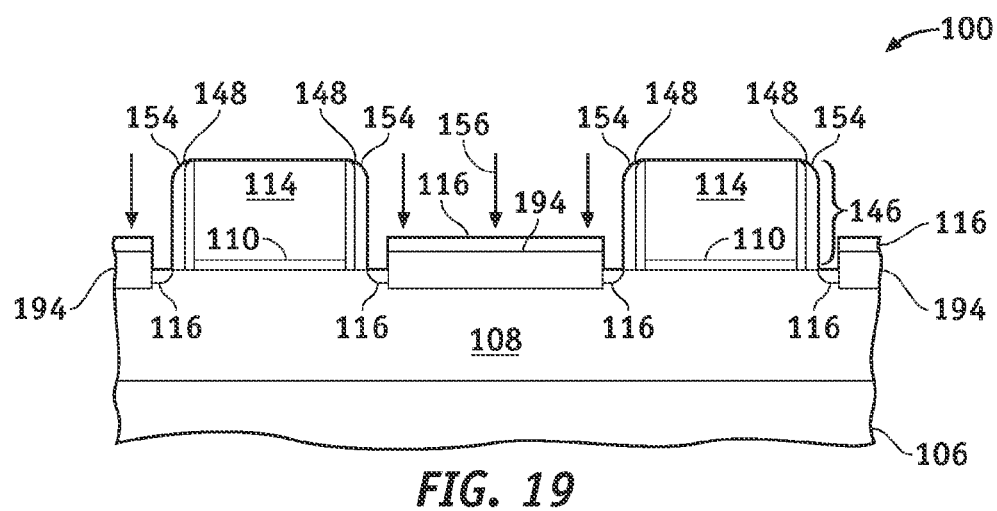

After formation of the trench 192, a silicon layer 194 is epitaxially grown within trench 192, as illustrated in FIG. 18. The epitaxial silicon layer 194 can be grown using, for example, the process described above for the growth of epitaxial silicon layer 170. The epitaxial silicon layer 194 may comprise relatively pure silicon materials or may comprise silicon admixed with other elements such as germanium, carbon, and the like, for example, to introduce stress into the semiconductor substrate 106. The epitaxial silicon layer 194 can be grown to any thickness desired for a particular device design or application. In an exemplary embodiment, the epitaxial silicon layer 194 can be grown to a thickness of, for example, about 40 to about 70 nm. Disposable spacer layer 190 is removed such as by etching, for example, by RIE in $CHF_3$, $CF_4$, or $SF_6$ chemistry, or in a wet etchant such as dilute HF, exposing portions of substrate 106. Referring to FIG. 19, offset spacers 154 then can be formed as described above. After formation of offset spacers 154, the reoxidation spacers 148 and the offset spacers 154 are used along with the gate stacks 146 as an ion implantation mask for formation of source and drain extensions 116 within epitaxial silicon layer 194 and the exposed portions of substrate 106. By using the gate stacks 146 and the spacers 148 and 154 as an ion implantation mask, the source and drain extensions are self aligned with the gate stacks and the spacers. The source and drain extensions may be formed using the processes described above, such as by ion implantation of dopant ions 156.

Figure 20:
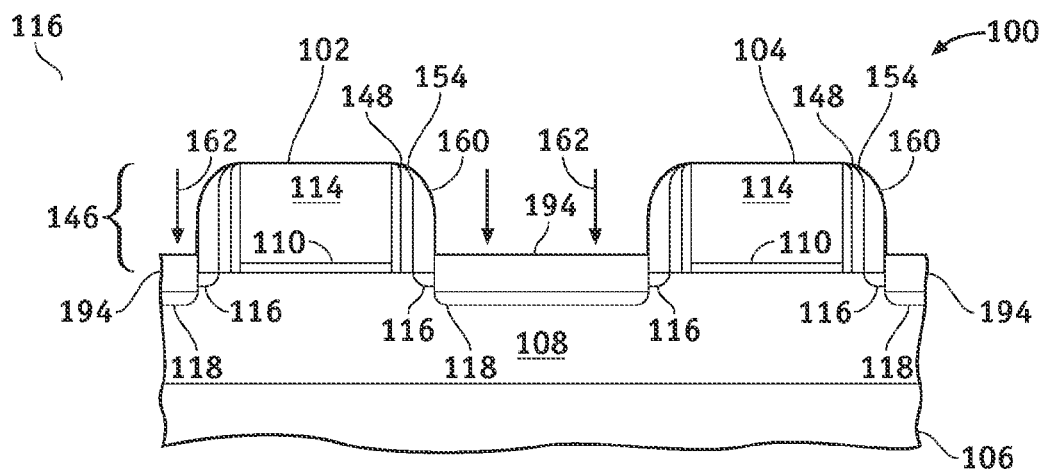

Referring to FIG. 20, after formation of the source and drain extensions 116, additional spacers 160 can be fabricated as described above to fill the gap created by the removal of spacers 190. As will be noted, dielectric layer 164 is not required in this embodiment because disposable spacer layer 190 was used to prevent epitaxial silicon growth on gate electrodes 114. The gate stacks 146, the reoxidation sidewall spacers 148, the offset spacers 154, and additional spacers 160 are used as an ion implantation mask to form deep source and drain regions 118 within epitaxial silicon layer 194 and in silicon substrate 106, thus forming MOS transistors 102 and 104. The source and drain regions can be fabricated as described above, such as by ion implantation of dopants 162. It will be understood that the source and drain extensions and regions also can be formed before or after various other steps of the method. For example, both the source and drain extensions and regions can be formed before growth of the epitaxial silicon layer, although it may be desirable to implant dopant ions into the epitaxial silicon layer after it is grown.

Figure 11:
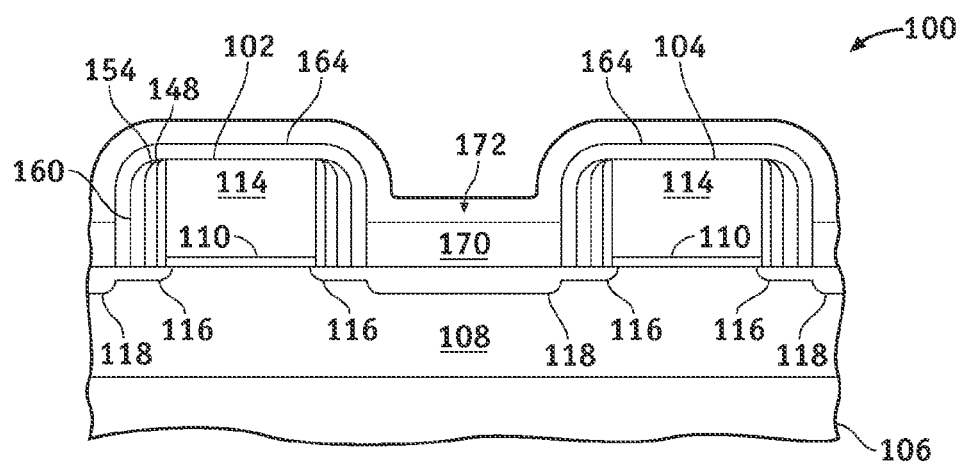
Figure 12:
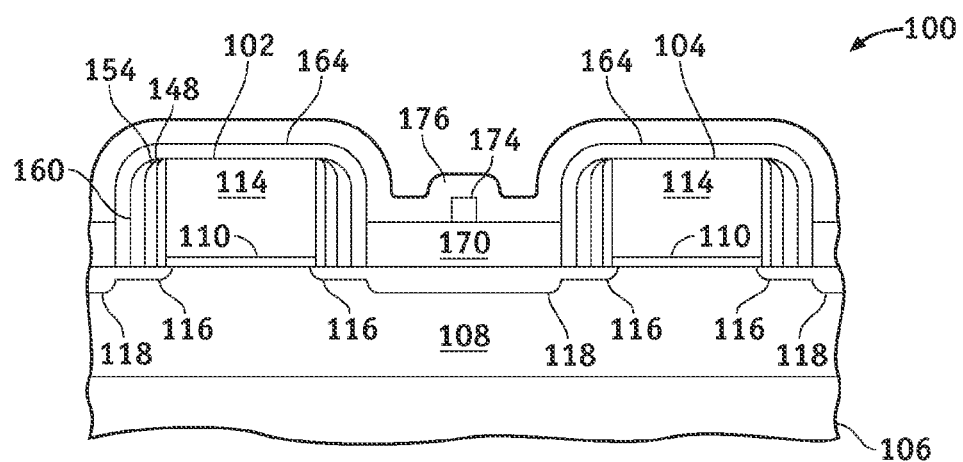

Regardless of when the source and drain regions and extensions are formed, the method continues in accordance with an exemplary embodiment of the invention with the deposition of a dielectric material layer 172, preferably a silicon dioxide layer overlying MOS structure 100, as illustrated in FIG. 11. The dielectric material layer 172 is deposited to a thickness of, for example, about 20 to about 50 nm. A layer of photoresist (not shown) is applied and patterned and the exposed portion of dielectric material layer 172 then is removed such as by etching, for example, by RIE in a $CHF_3$, $CF_4$, or $SF_6$ chemistry to form pillar 174 on epitaxial silicon layer 170, as illustrated in FIG. 12. The photoresist then can be removed by conventional methods. Another layer 176 of dielectric material having an etching characteristic different from that of pillar 174 is deposited overlying MOS structure 100. For example, when pillar 174 is formed of silicon oxide, layer 176 may comprise silicon nitride. The dielectric material layer 176 is deposited to a thickness of, for example, about 40 nm to about 80 nm.

Figure 13:
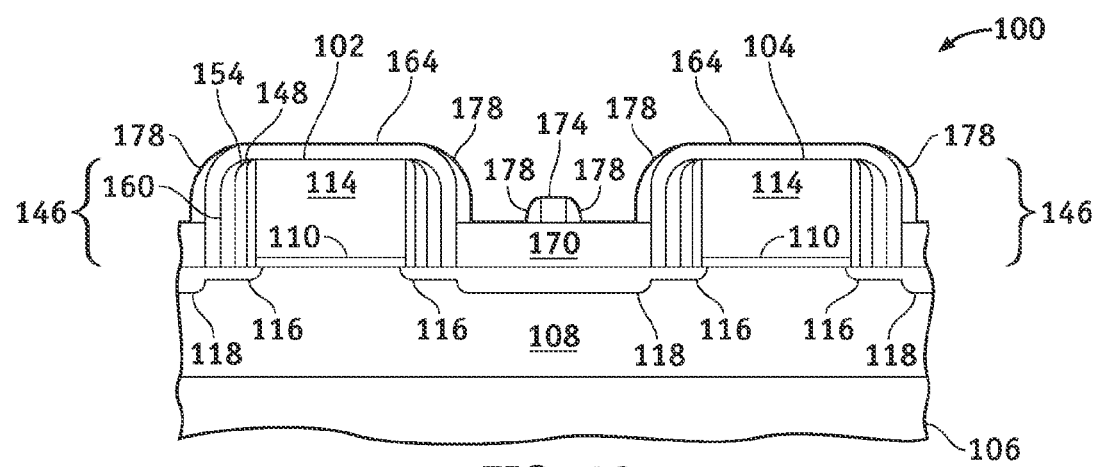
Figure 14:
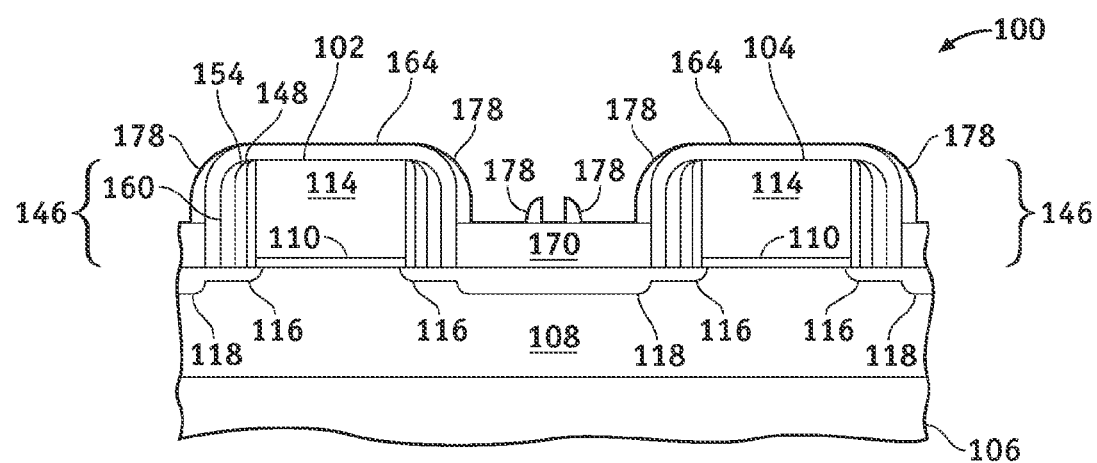

The layer 176 of dielectric material is subsequently anisotropically etched, for example by RIE using, for example, a $CHF_3$, $CF_4$, or $SF_6$ chemistry, to form spacers 178 disposed about pillar 174 and about gate stacks 146, as illustrated in FIG. 13. The pillar 174 then is etched, leaving free-standing spacers 178 on epitaxial silicon layer 170, as illustrated in FIG. 14. At least a portion of exposed dielectric layer 164 also may be etched during etching of pillar 174.

Figure 15:
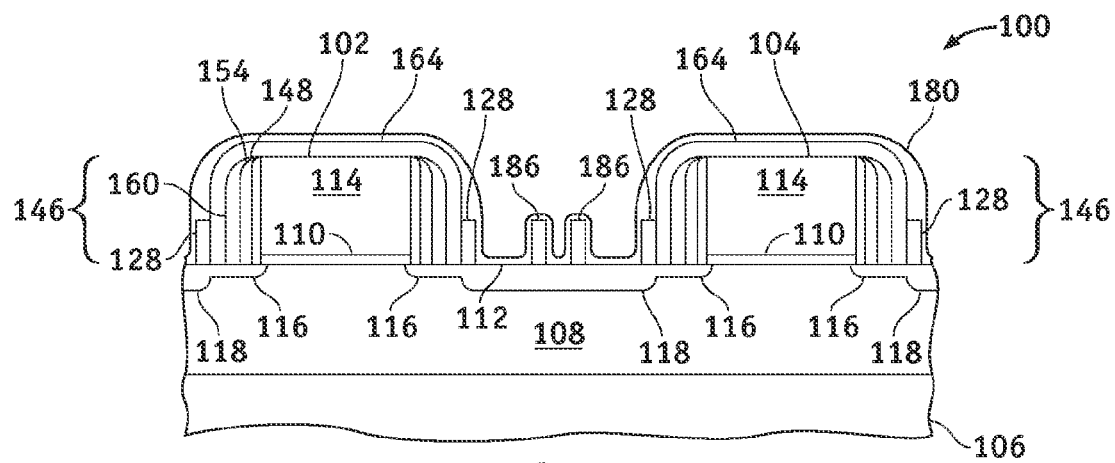

Referring to FIG. 15, exposed portions of epitaxial silicon layer 170 are etched using spacers 178 as an etch mask to form fins 128 disposed on surface 112 of substrate 106. Fins 128 include two contact fins 186, which are each stand-alone fins disposed between gate stacks 146. The epitaxial silicon layer 170 is etched, for example, by reactive ion etching using a $HBr/O_2$ and Cl chemistry. If not formed as described above with reference to FIG. 10, source and drain regions 118 then can be formed by appropriately impurity doping silicon substrate 106, as described above. During formation of the source and drain regions 118, fins 128 also are doped. A blanket layer 180 of silicide-forming metal is deposited overlying MOS structure 100. The silicide-forming metal layer 180 is heated, for example, by RTA to form a metal silicide layer 126 on fins 128 and on surface 112 of substrate 106, as illustrated in FIG. 16. The silicide-forming metal can be, for example, cobalt, nickel, rhenium, ruthenium, or palladium, or alloys thereof. The silicide-forming metal can be deposited, for example, by sputtering to a thickness of about 5-50 nm and preferably to a thickness of about 10 nm. Any silicide-forming metal that is not in contact with exposed silicon, for example the silicide-forming metal that is deposited on dielectric layer 164, does not react during the RTA to form a silicide and may subsequently be removed by wet etching in a $H_2O_2/H_2SO_4$ or $HNO_3/HCl$ solution. After forming the metal silicide layer, a layer of dielectric material 124 is deposited overlying MOS transistors 102 and 104 and fins 128.

The method continues, in accordance with an exemplary embodiment of the invention, with the patterning and etching of the dielectric material layer 124 to form a contact opening 182 extending through dielectric material layer 124 and exposing at least a portion of the metal silicide layer 126 on contact fins 186 and on surface 112 of substrate 106. The dielectric material layer may be planarized by a CMP process before patterning. In one exemplary embodiment, at least that portion of the metal silicide layer 126 that is disposed on one sidewall 184 of one fin 186 is exposed. In another exemplary embodiment of the invention, at least that portion of the metal silicide layer 126 that is disposed on both sidewalls 184 of both contact fins 186 is exposed. Conductive contact 122 is formed in contact opening 182 so that the source and drain regions can be appropriately connected electrically to other devices in the integrated circuit to implement the desired circuit function. In an exemplary embodiment of the present invention, conductive contact 122 is formed by the deposition of a thin first barrier layer, such as, for example, TiN (not shown), and a thin second barrier layer (not shown), such as, for example, titanium, within contact opening 180, followed by the deposition of a conductive plug (not shown), such as, for example, W. The barrier layers are used to prevent diffusion of tungsten hexafluoride $WF_6$, used during formation of the conductive plug, into the dielectric material layer 124 and to enhance adhesion of the conductive plug to the walls of the contact opening. It will be appreciated that other layers may be utilized to form conductive contact 122. For example, a layer of tantalum may be deposited before the barrier layer is formed. In an exemplary embodiment of the invention, width 134 of the contact 122 is sufficiently large and the contact 122 is positioned relative to the contact fins 186 so that contact 122 is in physical contact with the metal silicide layer 126 on at least one of the sidewalls 184 of at least one of the contact fins 186. Accordingly, interface 130 is greater than width 134, that is, greater than interface 132 (of FIG. 28) between contact 122 and that portion of surface 112 of substrate 106 upon which metal silicide layer 126 would lie without contact fins 186. In this regard, as described above, the increase in the interface between contact 122 and the metal silicide 126 results in a decrease in contact resistance, which in turn results in an increase in device performance.

FIGS. 21-25 illustrate, in cross section, a method for fabricating an MOS structure 200 in accordance with another exemplary embodiment of the present invention. The method illustrated in FIGS. 21-25 is similar to the method illustrated in FIGS. 1-16 to the extent that it also forms a feature that increases the surface area of the interface between the contact and the source and drain regions. In contrast to fins, however, the feature formed during the method illustrated in FIGS. 21-25 is a trench.

Figure 21:
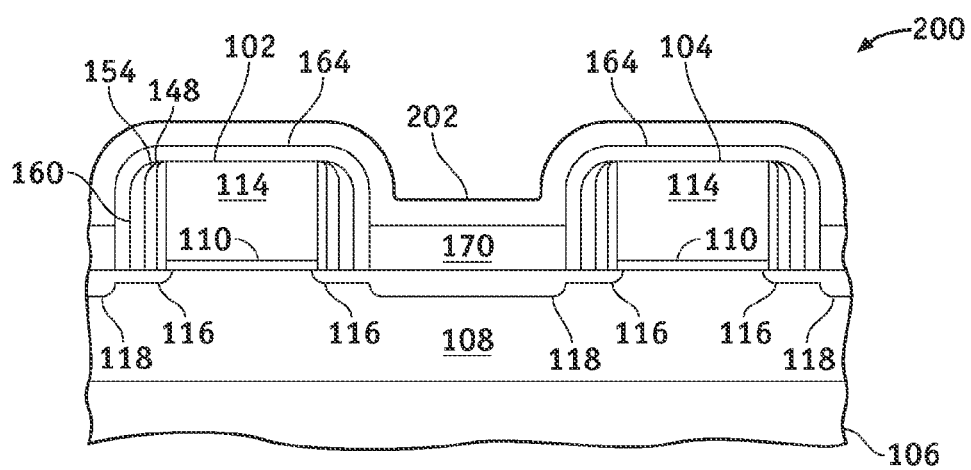
FIGS. 21-25 illustrate, in cross section, a method for fabricating an MOS structure in accordance with another exemplary embodiment of the present invention.
Figure 22:
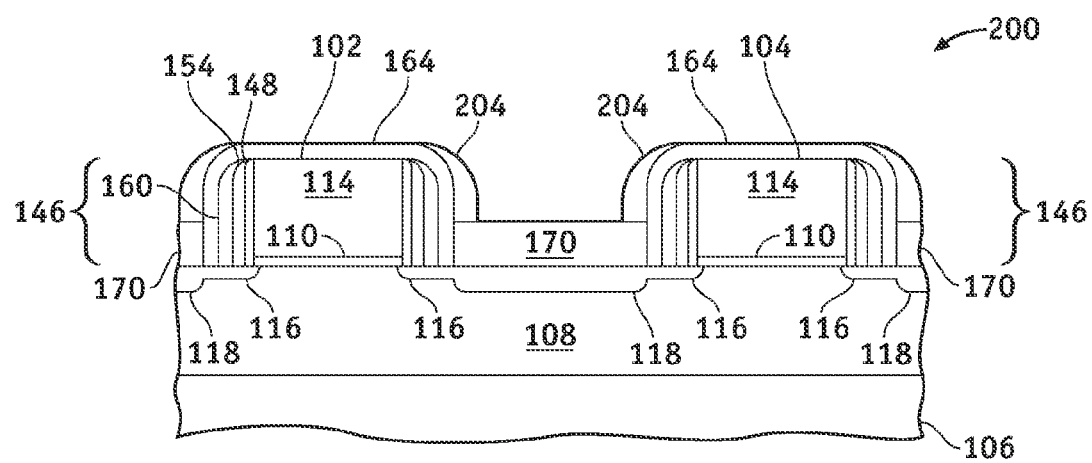

In this regard, the method begins with the steps illustrated in FIGS. 1-10 and, after doping of epitaxial silicon layer 170, a conformal layer 202 of dielectric material, such as silicon oxide or, preferably, silicon nitride, is deposited overlying MOS structure 200, as illustrated in FIG. 21. Dielectric material layer 202 can be deposited to a thickness of, for example, about 15 to about 50 nm. Layer 202 is anisotropically etched, as described above, to form disposable spacers 204 about gate stacks 146, as illustrated in FIG. 22.

Figure 23:
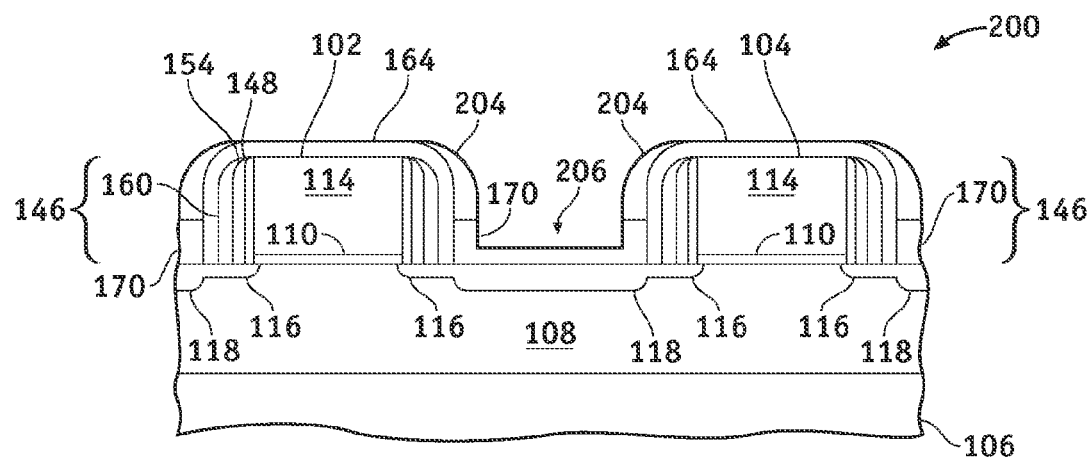
Figure 24:
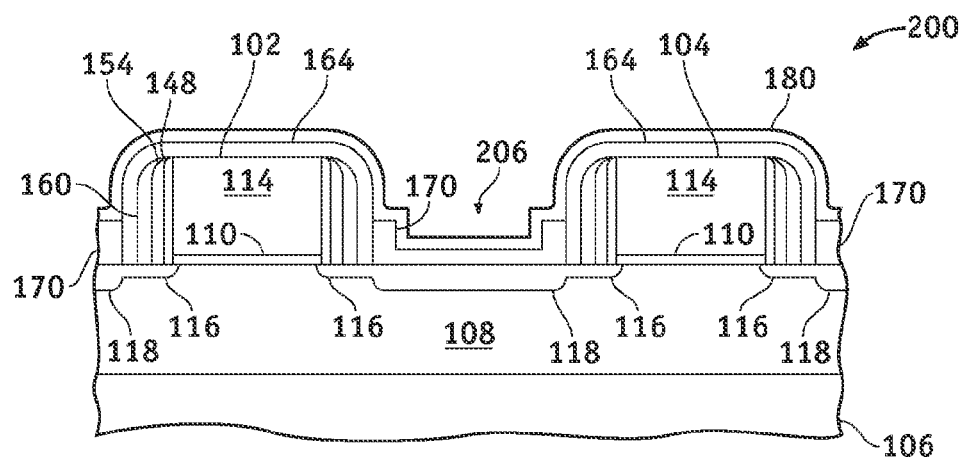
Figure 25:
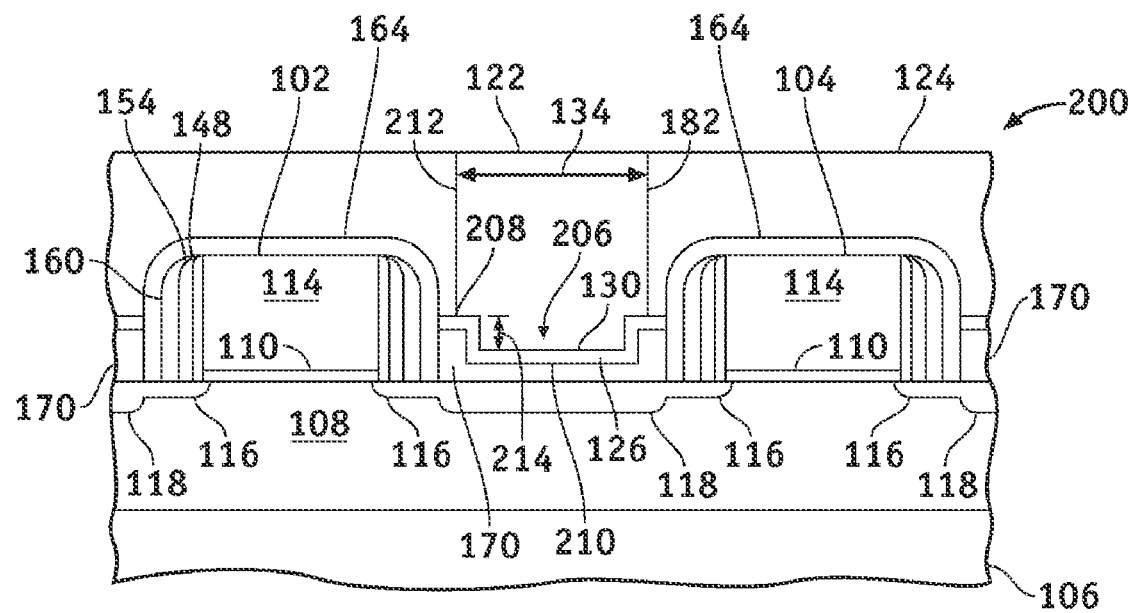

Referring to FIG. 23, epitaxial silicon layer 170 is etched, with disposable spacers 204 and gate stacks 146 serving as an etch mask, to form a trench 206. In one exemplary embodiment of the present invention, trench 206 terminates within epitaxial silicon layer 170. Disposable spacers 204 then may be removed by, for example, using a wet clean step or by using an anisotropic etch with a high selectivity to the epitaxial silicon layer 170 and the silicon substrate 106. A blanket layer 180 of silicide-forming metal is deposited overlying MOS structure 200, as illustrated in FIG. 24. The silicide-forming metal layer 180 is heated, for example, by RTA to form a metal silicide layer 126 on epitaxial silicon layer 170 and within trench 206, as illustrated in FIG. 25.

After forming the metal silicide layer, dielectric material layer 124 is deposited overlying MOS structure 200. The dielectric material layer 124 is patterned and etched to form contact opening 182 extending through dielectric material layer 124 and exposing the metal silicide layer 126 on epitaxial silicon layer 170. Conductive contact 122 then is formed in contact opening 182, as described above. In an exemplary embodiment of the invention, the contact 122 is sufficiently wide, and is positioned relative to MOS transistors 102 and 104, so that at least one sidewall 212 of contact 122 terminates at a top surface 208 of metal-silicided epitaxial silicon layer 170 rather than on a trench surface 210 within trench 206. In this regard, the interface 130 between the conductive contact 122 and the metal silicide layer 126 is greater than the interface 132 of FIG. 28 by at least a height, indicated by double-headed arrow 214, of the sidewall 212. Accordingly, the increase in the interface results in a decrease in contact resistance and, hence, an increase in device performance. In a preferred embodiment of the present invention, the contact 122 is sufficiently wide, and is positioned relative to MOS transistors 102 and 104, so that both sidewalls 212 of contact 122 terminate at a top surface 208 of metal-silicided epitaxial silicon layer 170 rather than on a trench surface 210 within trench 206.

Figure 26:
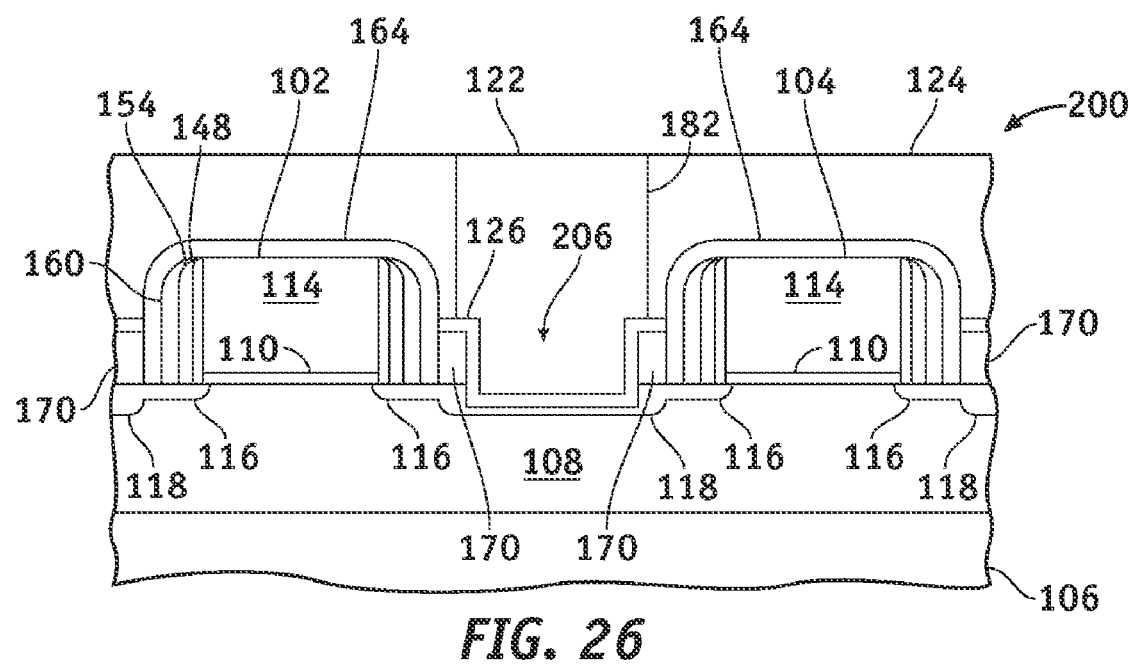
FIG. 26 illustrates, in cross section, a method for fabricating an MOS structure in accordance with a further exemplary embodiment of the present invention.
Figure 27:
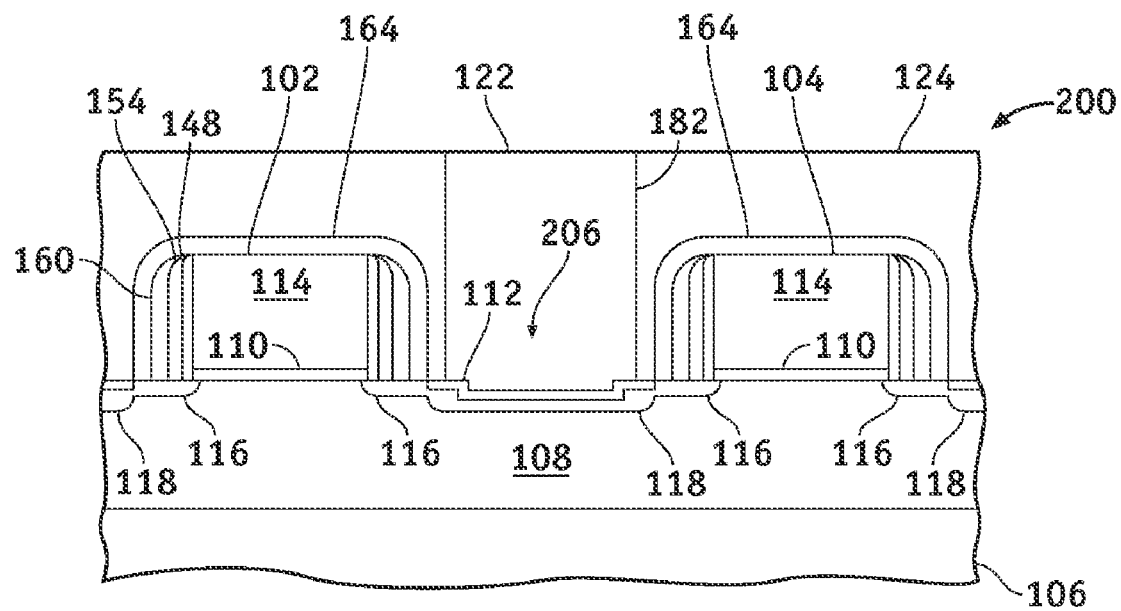
FIG. 27 illustrates, in cross section, a method for fabricating an MOS structure in accordance with another exemplary embodiment of the present invention.

In another exemplary embodiment of the invention, illustrated in FIG. 26, trench 206 extends through epitaxial silicon layer 170 and terminates within source/drain region 118. In this regard, the interface between the contact 122 and the metal silicide 126 is even greater due to the increased depth of the trench. In yet another exemplary embodiment of the invention, illustrated in FIG. 27, epitaxial silicon layer 170 is absent and trench 206 extends from surface 112 of substrate 106 and terminates within source/drain region 118. In this regard, the step of epitaxially growing silicon layer 170 is eliminated, thus increasing the speed of device fabrication.

Accordingly, MOS structures that exhibit lower contact resistance have been provided. The MOS structures comprise a feature that allows for an increase in the surface area of the interface between a conductive contact and a metal silicide layer that is electrically coupled to source and drain regions of an MOS device. Because a large part of the contact resistance is due to the barrier layer material at the interface of the contact and the metal silicide layer (for example, because the resistivity of a TiN/Ti barrier layer combination is much higher than that of a tungsten contact), increasing the interface area results in an effective reduction of contact resistance.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating an MOS structure, the method comprising the steps of:
   providing a semiconductor substrate;
   fabricating a gate stack on the semiconductor substrate;
   forming an impurity-doped region within the semiconductor substrate aligned with the gate stack;
   epitaxially growing a silicon-comprising material overlying the semiconductor substrate, the silicon-comprising material selected from the group consisting of relatively pure silicon, a silicon- and carbon-comprising material, and a silicon- and germanium-comprising material;
   etching the epitaxially-grown silicon-comprising material to form two adjacent contact fins on the semiconductor substrate;
   forming a metal silicide layer on the contact fins; and
   fabricating a contact to at least a portion of the metal silicide layer on at least one of the contact fins.

2. The method of claim 1, wherein the step of epitaxially growing a silicon-comprising material comprises the step of epitaxially growing the silicon-comprising material to a thickness in the range of about 10 nm to about 50 nm.

3. The method of claim 1, wherein the step of forming an impurity-doped region comprises the step of implanting ions of a conductivity-determining type within the semiconductor substrate using the gate stack as an ion implantation mask, and wherein the step of implanting is performed after the step of epitaxially growing the silicon-comprising material.

4. The method of claim 1, wherein the step of etching the epitaxially-grown silicon-comprising material comprises the steps of:
   depositing a first dielectric material layer on the epitaxially-grown silicon-comprising material;
   etching the first dielectric material layer to form a pillar on the epitaxially-grown silicon-comprising material;
   depositing a second dielectric material layer overlying the epitaxially-grown silicon-comprising material and the pillar;
   etching the second dielectric material layer to form spacers about the pillar;
   removing the pillar; and
   etching the epitaxially-grown silicon-comprising material using the spacers as an etch mask.

5. The method of claim 4, wherein the step of depositing a second dielectric material layer comprises the step of depositing the second dielectric material layer to a thickness in the range of about 40 nm to about 80 nm.

6. The method of claim 1, wherein the step of fabricating a contact to at least a portion of the metal silicide layer on at least one of the contact fins comprises the steps of:

depositing a blanket layer of dielectric material overlying the gate stack, the contact fins, and the impurity-doped region;

etching a contact opening in the dielectric material layer to expose at least a portion of the metal silicide layer on the contact fins; and depositing a conductive material within the contact opening.

7. The method of claim 1, wherein the step of fabricating a contact comprises the step of fabricating the contact such that a width of the contact is sufficiently large and the contact is positioned relative to the adjacent contact fins so that the contact is in physical contact with the metal silicide layer on at least one sidewall of at least one of the contact fins.

8. The method of claim 1, wherein the step of fabricating a contact comprises the step of fabricating the contact such that a width of the contact is sufficiently large and the contact is positioned relative to the adjacent contact fins so that an interface between the contact and the metal silicide layer is greater than an interface between the contact and that portion of the impurity-doped region upon which the metal silicide layer would lie without the contact fins.

9. A method for fabricating an MOS structure, the method comprising the steps of:

providing a semiconductor substrate;

fabricating a gate stack on the semiconductor substrate;

forming an impurity-doped region within the semiconductor substrate aligned with the gate stack;

epitaxially growing a silicon-comprising material overlying the semiconductor substrate;

etching the epitaxially-grown silicon-comprising material to form two adjacent contact fins on the semiconductor substrate, wherein the step of etching the epitaxially-grown silicon-comprising material comprises the steps of:

depositing a first dielectric material layer on the epitaxially-grown silicon-comprising material;

etching the first dielectric material layer to form a pillar on the epitaxially-grown silicon-comprising material;

depositing a second dielectric material layer overlying the epitaxially-grown silicon-comprising material and the pillar;

etching the second dielectric material layer to form spacers about the pillar;

removing the pillar; and etching the epitaxially-grown silicon-comprising material using the spacers as an etch mask;

forming a metal silicide layer on the contact fins; and fabricating a contact to at least a portion of the metal silicide layer on at least one of the contact fins.

* * * * *